(12) United States Patent
Salama et al.

(10) Patent No.: US 7,023,050 B2
(45) Date of Patent: Apr. 4, 2006

(54) SUPER JUNCTION / RESURF LDMOST (SJR-LDMOST)

(76) Inventors: C. Andre T. Salama, 66 Castlewood Road, Toronto, Ontario (CA) M5N 2L2; Sameh Khalil Nassif, 222 Elm Street, Apt. #200, Toronto, Ontario (CA) M5T 1K5

( * ) Notice: Subject to any disclaimer, the term of this patent is extended or adjusted under 35 U.S.C. 154(b) by 0 days.

(21) Appl. No.: 10/617,487

(22) Filed: Jul. 11, 2003

(65) Prior Publication Data

US 2005/0017300 A1    Jan. 27, 2005

(51) Int. Cl.
  *H01L 29/76* (2006.01)
  *H01L 29/94* (2006.01)
  *H01L 31/062* (2006.01)
  *H01L 31/119* (2006.01)

(52) U.S. Cl. .................. 257/341; 257/335; 257/342

(58) Field of Classification Search ............. 257/335, 257/341, 342, 491–493
  See application file for complete search history.

(56) References Cited

U.S. PATENT DOCUMENTS

| | | | |
|---|---|---|---|
| 4,754,310 A | 6/1988 | Coe .................. | 357/13 |
| 5,216,275 A | 6/1993 | Chen ................. | 257/493 |
| 5,438,215 A | 8/1995 | Tihanyi .............. | 257/401 |
| 6,297,534 B1 * | 10/2001 | Kawaguchi et al. ..... | 257/341 |
| 6,756,636 B1 * | 6/2004 | Onishi et al. ........ | 257/342 |
| 6,777,746 B1 * | 8/2004 | Kitagawa et al. ...... | 257/335 |
| 6,815,293 B1 * | 11/2004 | Disney et al. ........ | 438/268 |
| 2003/0190789 A1 | 10/2003 | Salama et al. ........ | 438/286 |
| 2003/0214009 A1 * | 11/2003 | Parthasarathy et al. . | 257/492 |
| 2003/0219933 A1 * | 11/2003 | Yamauchi et al. ...... | 438/156 |
| 2003/0222327 A1 * | 12/2003 | Yamaguchi et al. ..... | 257/500 |
| 2004/0212032 A1 * | 10/2004 | Onishi et al. ........ | 257/491 |
| 2004/0232483 A1 * | 11/2004 | Kitagawa et al. ...... | 257/335 |

OTHER PUBLICATIONS

"High Voltage Thin Layer Devices (Resurf Devices)"; J.A. Appels et al.; IEEE International Electron Device Meeting (IEDM); Dig. Tech Papers; pp. 238-241; 1979.

"Theory of a novel voltage-sustaining layer for power devices"; X.B. Chen et al.; Microelectronics Journal, vol. 29; pp. 1005-1011; 1998.

(Continued)

*Primary Examiner*—Mary Wilczewski
*Assistant Examiner*—Monica Lewis
(74) *Attorney, Agent, or Firm*—Rossi, Kimms & McDowell, LLP

(57) ABSTRACT

A lateral double diffused MOSFET (LDMOST) incorporates both the reduced surface field (RESURF) and super junction (SJ) in a split-drift region to significantly improve the on-state, off-state and switching characteristics in junction-isolated (JI) technology. The structure effectively suppresses substrate-assisted-depletion which is the main problem encountered when applying the SJ concept to lateral power devices. The device structure features a split-drift region formed of two parts: a SJ structure that extends over most of the drift region, and a terminating RESURF region occupying a portion of the drift region next to the drain. The structure offers improved breakdown voltage and reduced specific on resistance as compared to convention structures, and is useful in power integrated circuits suitable for a variety of applications including flat plasma panel display, automotive electronics, motor control, power supply and high voltage lamp ballasts.

11 Claims, 9 Drawing Sheets

OTHER PUBLICATIONS

"COOLMOS™—a new milestone in high voltage Power MOS"; L. Lorenz et al.; Proceedings of the 11$^{th}$ International Symposium on Power Semiconductor Devices and ICs (ISPSD); pp. 3-10; 1999.

Super Junction LDMOST in Silicon-On-Sapphire Technology (SJ-LDMOST); Sameh Nassif-Khalil et al.; International Symposium on Power Semiconductor Devices and ICs (ISPSD), Proceedings; pp. 81-84; 2002.

"170V Super Junction—LDMOST in a 0.5 μm Commercial CMOS/SOS Technology"; S.G. Nassif-Khalil et al.; International Symposium on Power Semiconductor Devices and ICs (ISPSD), Proceedings, accepted for publication; 4 pages.

"Extended (180V) Voltage in 0.6 μm Thin-Layer-SOI A-BCD3 Technology on 1 μm BOX for Display, Automotive & Consumer Applications"; A.W. Ludikhuize et al.; International Symposium on Power Semiconductor Devices and ICs (ISPSD), Proceedings; pp. 77-80; 2002.

"A Versatile 700-1200-V IC Process for Analog and Switching Applications"; Adriaan Ludikhuize; IEEE Transactions on Electron Devices, vol. 38; pp. 1582-1589; 1991.

Experimental Results and Simulation Analysis of 250V Super Trench Power MOSFET (STM); T. Nitta et al.; International Symposium on Power Semiconductor Devices and ICs (ISPSD), Proceedings; pp. 77-80; 2000.

"Super-Junction LDMOST on a Silicon-on-Sapphire Substrate"; S. Nassif-Khalil et al.; IEEE Transactions on Electron Devices, vol. 50, No. 5; May 2003; pp. 1385-1391.

* cited by examiner

| Device | Breakdown Voltage (V) | $R_{on-sp}$ ($\Omega.cm^2$) at $V_{GS}=12V$ |
|---|---|---|
| 120V SJR-LDMOST | 121 | $3.42 \times 10^{-3}$ |
| 120V conventional R-LDMOST | 120 | $2.1 \times 10^{-2}$ |
| 700V SJR-LDMOST | 718 | $4.88 \times 10^{-2}$ |
| 700V conventional R-LDMOST | 700 | 0.20 |
| 1200V SJR-LDMOST | 1244 | 0.22169 |
| 1100V conventional R-LDMOST | 1100 | 0.7 |

Fig. 10

SUPER JUNCTION / RESURF LDMOST (SJR-LDMOST)

BACKGROUND OF INVENTION

The present invention relates to semiconductor devices, and in particular to Lateral Double Diffused MOSFET (LDMOST) semiconductor devices.

In a conventional LDMOST, a well region and a source region are typically created via a double diffusion process or ion-implantation process by which the well region and source region are formed through a common opening window that is self-aligned to a gate. This technique facilitates control of the lateral diffusion of the impurities under the gate so that small channel lengths can be realized without the use of high-resolution photolithography. An example of a conventional n-well LDMOST 10 is illustrated in FIG. 1, and includes a p-well region 12 and an $n^+$ drain region 16 formed in an $n^-$ substrate 18. An $n^+$ source region 14 is formed within the p-well region 12. Current flows laterally from the source region 14 to the drain region 16, when an applicable control voltage is applied to the gate to form a channel (inversion layer) at the surface of the p-well region 12.

The p-well region 12 of the LDMOST is separated from the $n^+$ drain region 16 by an extended and lightly doped region known as a drift region 18. The drift region 18 supports high reverse bias voltage applied at the drain region 16 in an off-state. The vertical pn junction formed between the p-well region 12 and $n^-$ drift region 18, however, causes avalanche breakdown to occur at the surface of the device. The breakdown voltage (BV) of the device is less than that of the parallel plane pn diode with similar doping concentrations due to electric field crowding near the surface associated with the shallow and cylindrical shaped junction. To increase the BV of an LDMOST the doping concentration in the drift region 18 must be reduced and the length of the region increased. Such modifications, however, result in an increase in the device specific on-resistance, defined as the product of the device on-resistance and its area.

To overcome the limitations on breakdown voltage inherent in the LDMOST design, a Reduced Surface Field (RESURF) concept has been suggested for the LDMOST. For a detailed description of RESURF technology as incorporated in lateral devices, please see J. A. Appels and H. M. J. Vaes, "High Voltage Thin Layer Devices (RESURF Devices)", IEEE International Electron Device Meeting (IEDM), Dig. Tech Papers, pp 238–241, 1979, which is incorporated herein by reference. The RESURF concept, as applied to LDMOSTs, provides a mechanism by which the avalanche breakdown at the device surface can be avoided. A cross-section of a RESURF LDMOST (R-LDMOST) 20 implemented on a bulk silicon substrate 22 is illustrated in FIG. 2. Electrical isolation between devices is achieved by junction isolation (JI).

The typical R-LDMOST device is fabricated on a thin epitaxial layer of thickness $t_{epi}$, for example, the $n^-$ epitaxial layer 24 illustrated in FIG. 2. The RESURF technique employs the interaction between the depletion regions of two pn junction diodes to reduce the electric field at the surface. The first pn junction is the vertical junction between the $p^+$ well 28 and the $n^-$ epitaxial layer 24. The second pn junction is the horizontal junction formed by the $p^-$ substrate 22 and the $n^-$ epitaxial layer 24. Both of these junctions are reversed biased.

Surface breakdown of R-LDMOST devices is eliminated by vertically enhancing the depletion of the junction between the $p^+$ well 28 and the n-epitaxial layer 24 and the $p^-$ substrate 22 and the $n^-$ epitaxial layer 24, so that the drift region is fully depleted before the surface electric field reaches its critical breakdown value. Device breakdown then occurs in the bulk at the parallel plane junction formed between $p^-$ substrate 22 and $n^-$ epitaxial layer 24. The depletion process is accomplished by controlling the amount of charge carriers in the drift region. Optimum breakdown voltage is achieved provided the product of the epitaxial layer 24 doping concentration $N_D$ and the epitaxial layer 24 thickness of $t_{epi}$ is in the order of $1 \times 10^{12}$ cm$^{-2}$ to $2 \times 10^{12}$ cm$^{-2}$. This condition, known as the RESURF condition, puts a limit on the upper bound of the doping concentration in the drift region and hence the minimum achievable specific on-resistance.

The Super Junction concept can be applied to LDMOST devices to increase the device breakdown voltage and decrease the resistivity of the drift region in high voltage LDMOSTs. For a more detailed understanding of Super Junction technology, refer to X. B. Chen, P. A. Mawby, K. Board and C. A. T. Salama, "Theory of a Novel Voltage Sustaining Layer for Power Devices", Microelectronics Journal, vol. 29, pp. 1005–1011, 1998, or to L. Lorenz, G. Deboy, A. Knapp and M. Marz, "COOLMOS™—A New Milestone in High Voltage Power MOS", Proceedings of the 11$^{th}$ International Symposium on Power Semiconductor Devices and ICs (ISPSD), pp. 3–10, 1999, both of which are incorporated herein by reference. For a more explicit explanation of the methods by which SJ regions can be manufactured, refer to T. Nitta, T. Minato, M. Yano, A. Uenisi, M. Harada and S. Hine, "Experimental Results and Simulation Analysis of 250V Super Trench Power MOSFET (STM)", International Symposium on Power Semiconductor Devices and ICs (ISPSD), Proceedings, pp. 77–80, 2000, the contents of which are incorporated herein by reference.

An example of a Super Junction LDMOST (SJ-LDMOST) known in the prior art is shown in FIG. 3. In the SJ-LDMOST device, the low doped drift region of conventional devices is replaced with a region 32 composed of alternatively stacked, heavily doped n-layers 34 and p-layers 35 called the SJ pillars. The SJ pillars provide a mechanism by which charge compensation can be achieved in the drift region. A SJ drift region 32 is shown in FIG. 4(a). For charge compensation to occur, the pillars must have equal integrated doping levels; i.e. the product of the pillar doping concentration and its width must be identical for all pillars. The condition for charge compensation, assuming uniform doping profile in the pillars is given by $$q.N_D.Y_n = q.N_A.Y_p \qquad (1)$$

where q is the electronic charge and $N_D$, $N_A$ are the net impurity doping concentration in the n-pillar and p-pillar respectively and $Y_n$, $Y_p$ are the respective widths of the pillars.

When a reverse bias is applied to the structure, the resultant electric field depletes the pillars of their charge carriers, moving them in opposite directions towards their respective ohmic contacts as shown in FIG. 4(a). The depletion region edges spread out into neighboring SJs. The edges of the depletion regions must merge before the maxi mum field at the junctions reach the critical electric field value. Quantitatively this condition can be expressed as $$\frac{q \cdot N_D \cdot Y_n}{2\varepsilon_s} = \frac{q \cdot N_A \cdot Y_p}{2\varepsilon_s} < E_c \quad (2)$$

where $E_c$ is the critical electric field in silicon and $\varepsilon_s$ is the silicon permittivity. Once the depletion regions of adjacent junctions merge the whole drift region becomes depleted of charge carriers. The bound ion charges in the pillars, which are equal in magnitude but opposite in polarity, cancel each other out causing the net charge across the drift region to be effectively zero. If charge compensation is in effect, a uniform electric field distribution over the drift region is obtained as shown in FIG. 4b.

The SJ structure results in a flat electric field distribution in the drift region 32 which yields the highest possible breakdown voltage for a given drift region length $L_D$ and is independent of the doping concentration in the drift region 32. That breakdown voltage is given by $$BV = E_C \cdot L_D \quad (3)$$

Another advantage of the SJ structure is the significant reduction of the specific on-resistance achieved by using high doping concentration in the n-pillars 34. The doping of the n-pillars 34 can be increased by one to two orders of magnitude as compared to conventional structures, thus compensating for the fact that half of the conducting area in the drift region is lost to the p-pillars.

High performance SJ-LDMOSTs require high and tightly matched pillar doping concentrations. If the pillar doping concentrations are not equal, charge imbalances occur in the pillars and result in a reduction in the breakdown voltage of the SJ device. This degradation effect becomes more pronounced at higher doping concentrations.

The design of the SJ device must also account for the charge imbalance caused by substrate-assisted-depletion. The termination of the SJ device with a substrate 36 of finite resistivity results in a severe reduction of the breakdown voltage. In the off-state, the p-pillars 35 are depleted by two neighboring n-pillars 34 (mutual depletion action), however the n-pillars 34 are depleted by their two neighboring p-pillars 35 as well as by the p⁻ substrate 36 (substrate-assisted-depletion). The mutual depletion action and the substrate-assisted-depletion are depicted in FIG. 5. A vertical electric field component exists between the p⁻ substrate 36 and the n-pillar 34. This electric field component is a function of lateral position along the drift region 32 and causes a surplus of one type of charge in the pillars. The substrate assisted depletion is most severe near the drain contact regions and diminishes quickly towards the p-well 38 as is evident by the equipotential contour plots shown in FIG. 6. The reference numerals of FIG. 6 refer to the following regions: 36 denotes the substrate, 62 the source region of the device, 64 the gate region, 65 the oxide region, 66 the drain region and 68 denotes the edge of the depletion region of the device.

SUMMARY OF THE PRESENT INVENTION

The modified LDMOST structure of the present invention incorporates the advantages of both the RESURF and SJ concepts in such a way that the breakdown voltage of the device can be increased while significantly decreasing the device specific on resistance. A primary feature of the device is the utilization of a split-drift region composed of two distinct portions. A first portion is a SJ region formed with a plurality of alternating heavily doped n and p-pillars of equal but opposite polarity doping concentration. The second portion of the drift region is a RESURF region with a lower doping concentration. Metal field plates extending over an oxide layer at the drain and gate regions may also be used to reduce field crowding at the drain and the under the gate. Due to the utilization of the dual SJ and RESURF (R) split-drift region, the device is preferably denoted as a SJR-LDMOST.

BRIEF DESCRIPTION OF THE DRAWINGS

Embodiments of the present invention will be described, by way of example, with reference to the accompanying drawings, wherein:

FIG. 10 shows a table comparing the characteristics of the device of FIG. 7 and those of traditional devices.

DETAILED DESCRIPTION OF THE PREFERRED EMBODIMENTS

Figure 1:
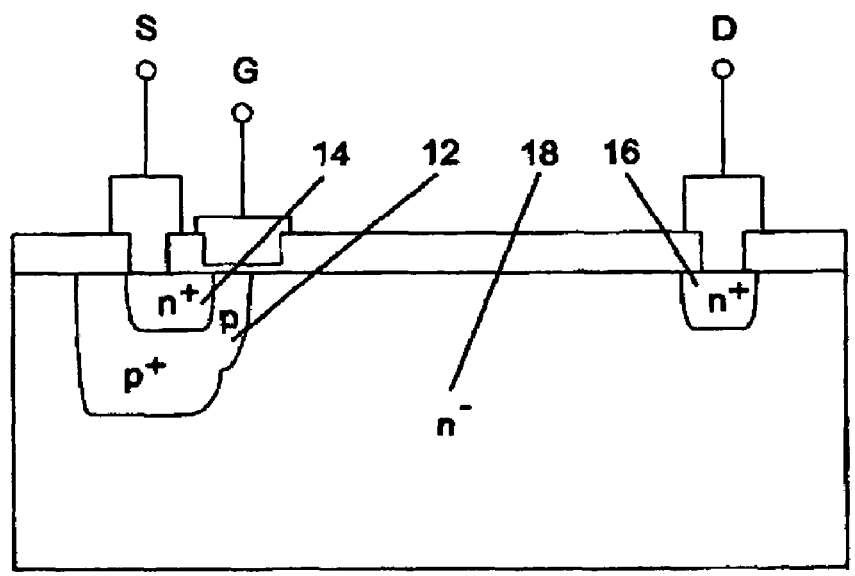
FIG. 1 depicts an LDMOST device of the prior art.
Figure 2:
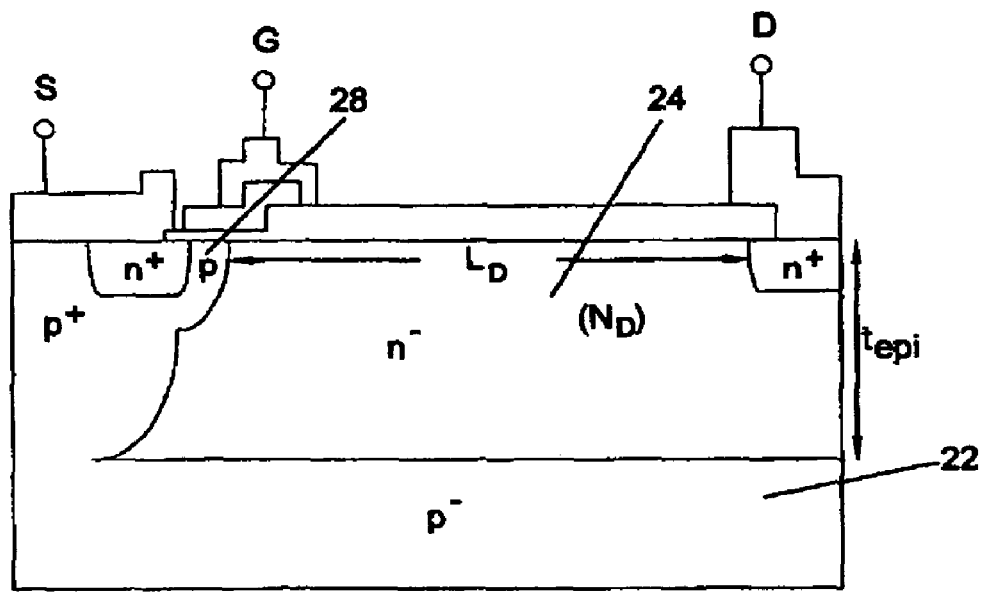
FIG. 2 depicts an R-LDMOST device of the prior art.
Figure 3:
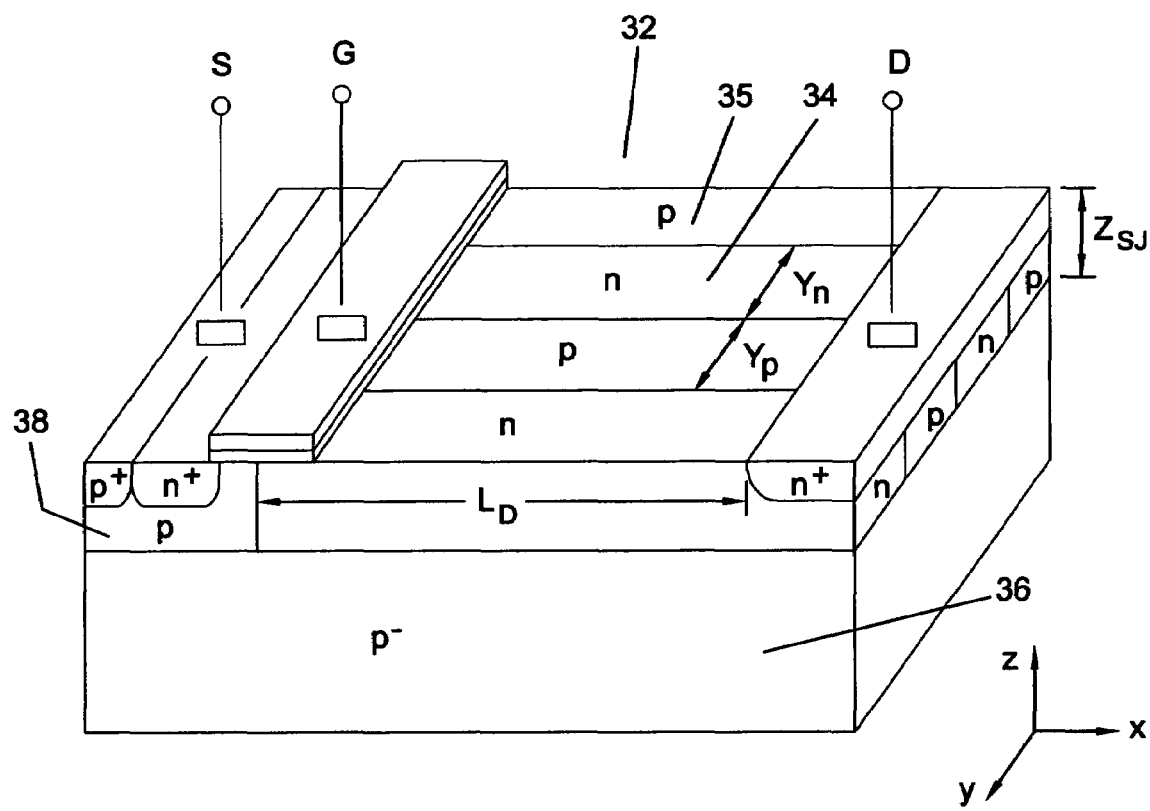
FIG. 3 depicts an SJ-LDMOST device of the prior art.
Figure 4:
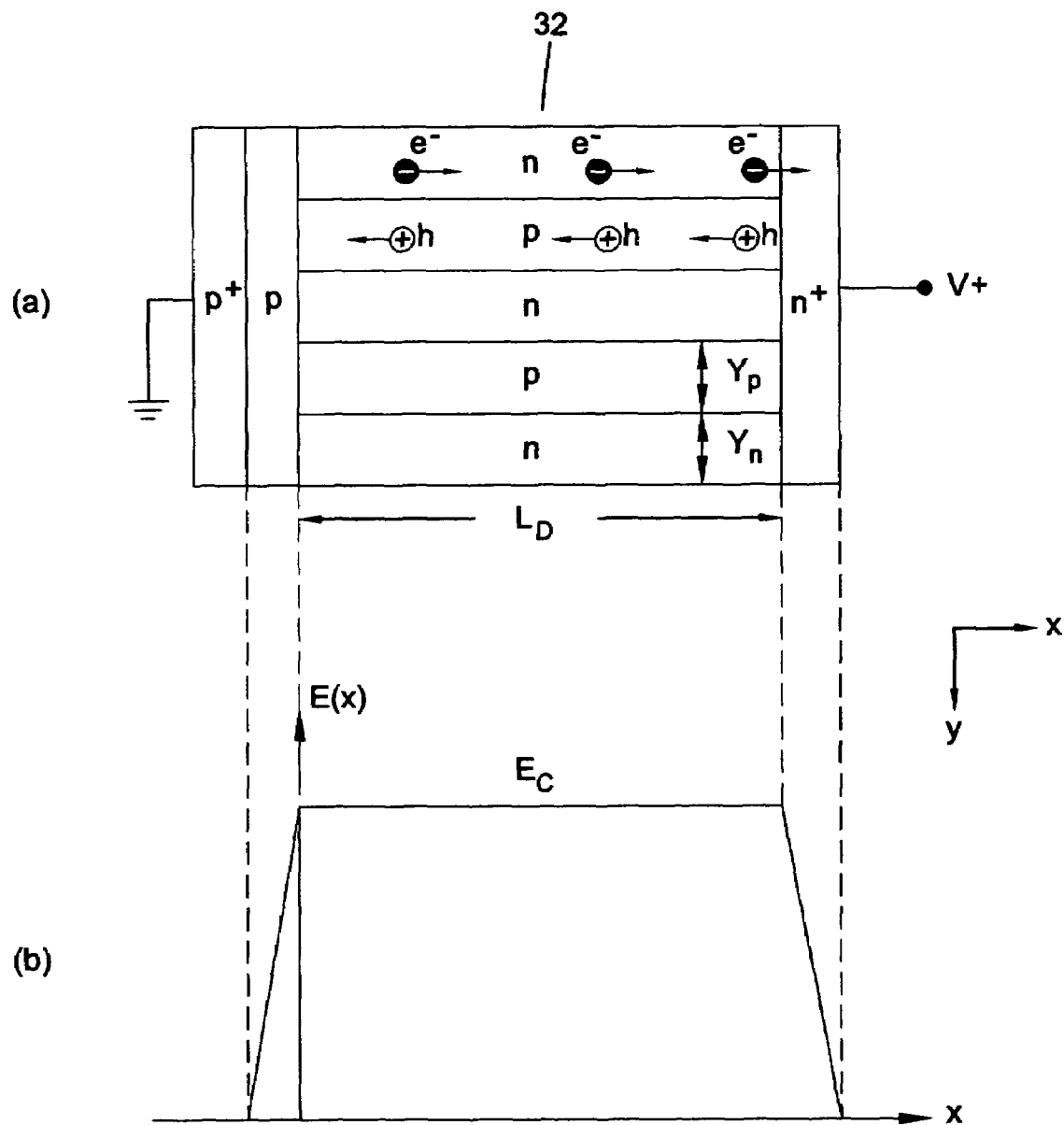
FIG. 4 depicts drift region characteristics of the device of FIG. 3.
Figure 5:
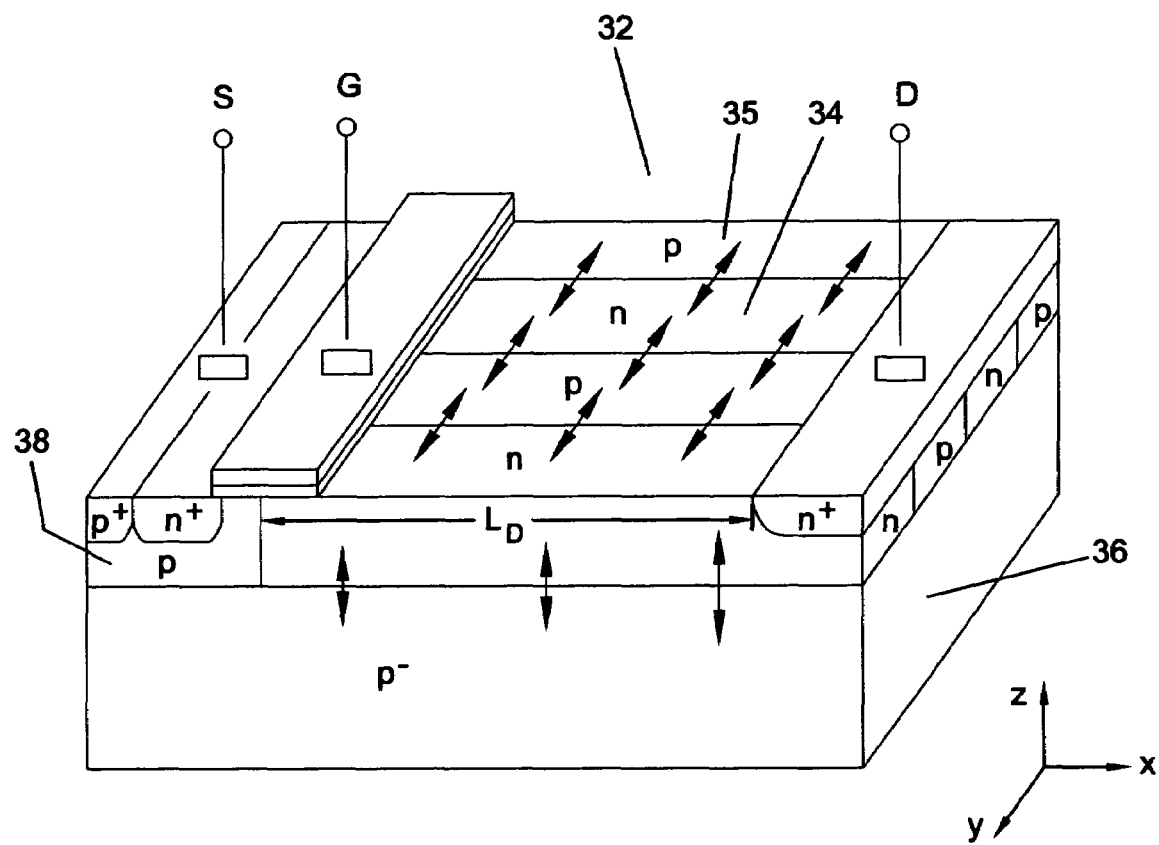
FIG. 5 depicts the depletion regions of the device of FIG. 3.
Figure 6:
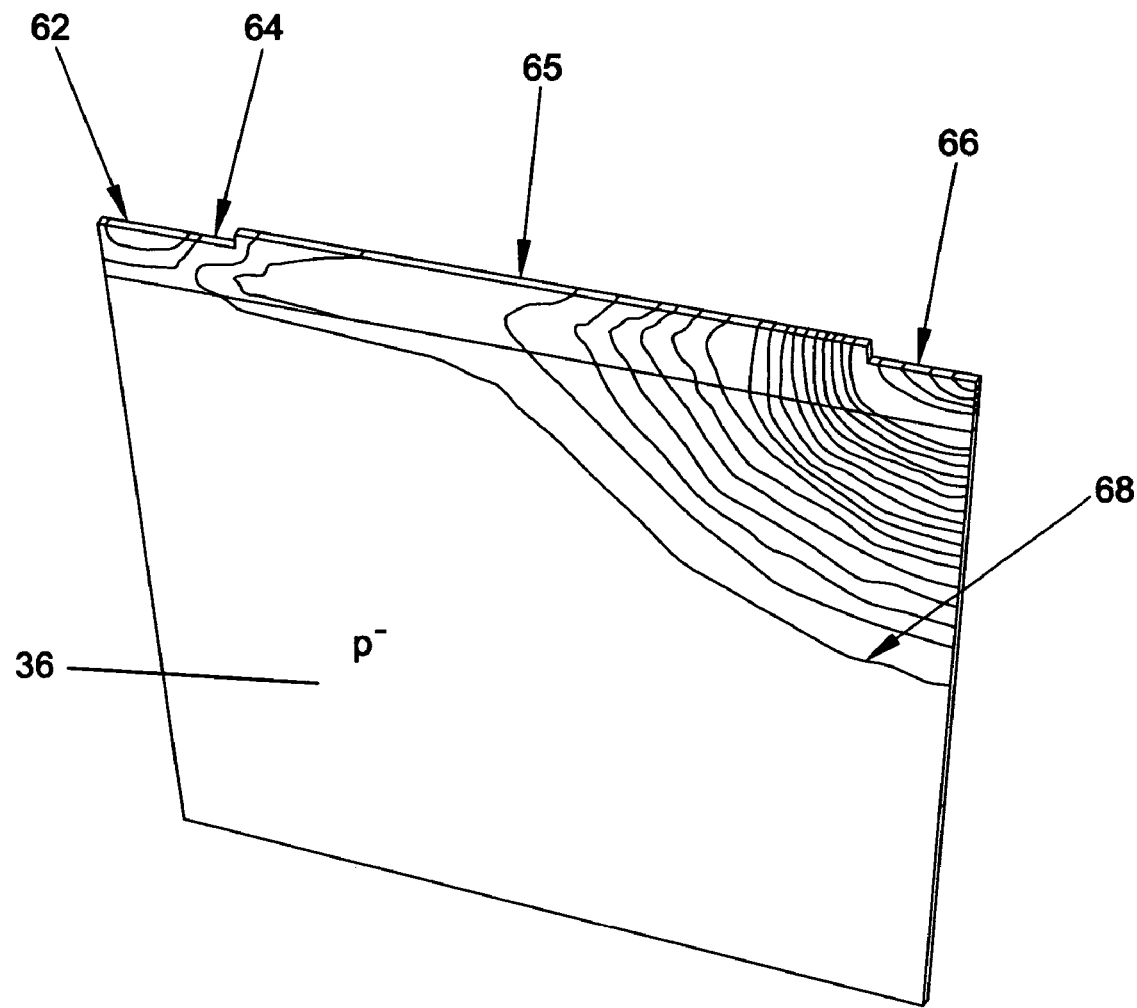
FIG. 6 depicts the equipotential plot of the device of FIG. 3.
Figure 7:
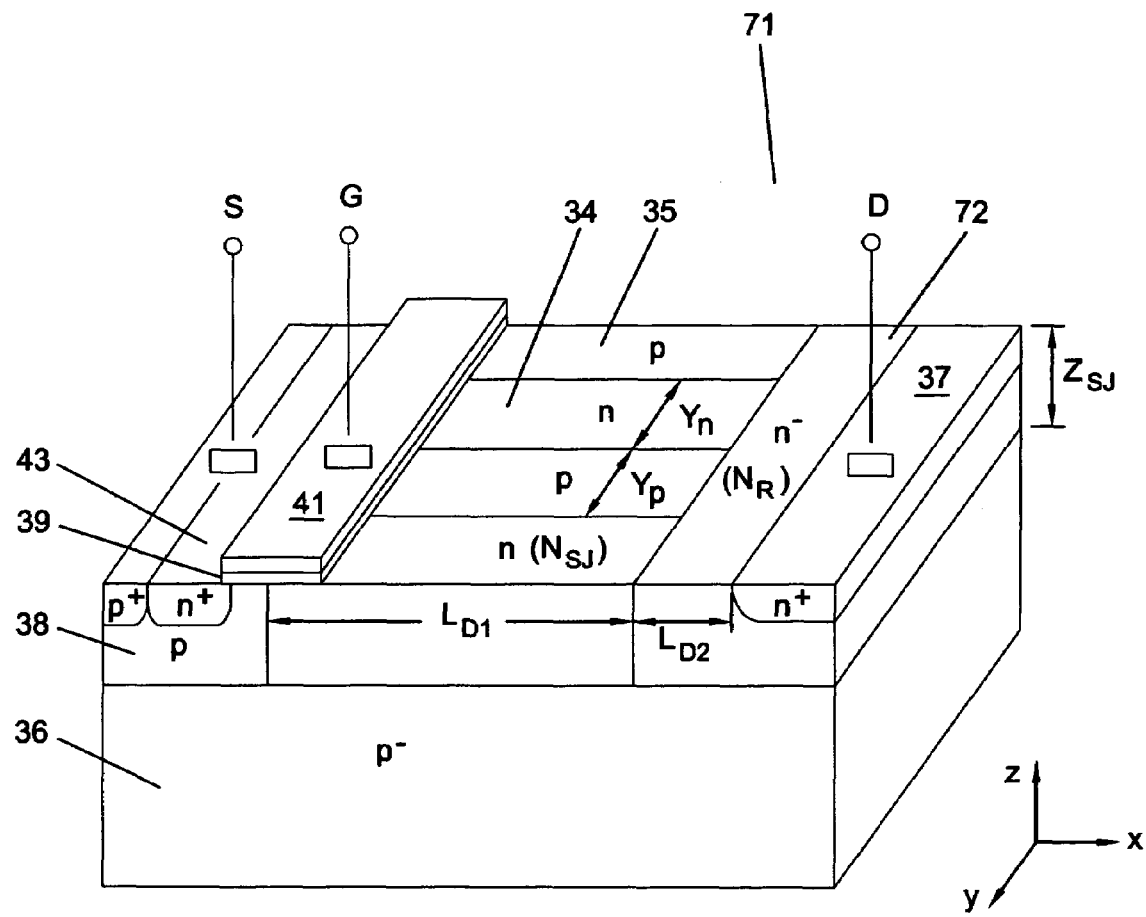
FIG. 7 depicts a preferred embodiment of the SJR-LDMOST.

A preferred embodiment of the present invention is illustrated in FIG. 7. The formation of the SJR-LDMOST 70 preferably includes the deposit of an epitaxial layer 72 on a substrate 36, where the epitaxial layer 72 has a doping polarity opposite to that of the substrate 36. In the embodiment shown in FIG. 7, a p⁻ substrate 36 is used in conjunction with an n⁻ epitaxial layer 72. The thickness of the epitaxial layer 72 is $Z_{SJ}$. An n⁺ drain region 37 is formed in a portion of the epitaxial layer 72 and a p-well region 38 is formed in another portion of the epitaxial layer 72 separate from the n⁺ drain region 37. An n⁺ source region 43 is formed within the p-well region 38. A gate region consisting of a thin oxide layer 39 covered with a gate electrode 41 straddles the p-well region 38. In operation, an inversion layer forms a channel at the surface of the p-well region 38 to allow current to flow between the n⁺ source region 43 and n⁺ drain region 37 when an appropriate control signal is applied to the gate. A split-drift region 71 is also provided between the n⁺ source region 43 and n⁺ drain region 37.

The split-drift region 71 is laterally bounded by the p-well 38 on one side and the n⁺ drain region 37 on the other side. The split-drift region 71 is preferably composed of two distinct portions. The first portion is a SJ region composed of a plurality of alternately arranged and heavily doped n-pillars 34 and p-pillars 35 of equal but opposite polarity doping concentrations $N_{SJ}$. Pillar widths $Y_N$, $Y_P$, are identical, and all pillars have length $L_{DI}$ and height $Z_{SJ}$, extending from the surface of the wafer to the p⁻ substrate 36. The pillars 34, 35 are formed in the epitaxial layer 72 by doping.

The second portion of the split-drift region is a RESURF portion formed by the epitaxial layer 72 remaining between the pillars 34, 35 and the drain 37. As illustrated in FIG. 7, the epitaxial layer 72 has a polarity opposite to that of the substrate, namely, the n⁻ region with doping concentration $N_R$, length $L_{D2}$ and thickness $Z_{SJ}$.

Figure 8:
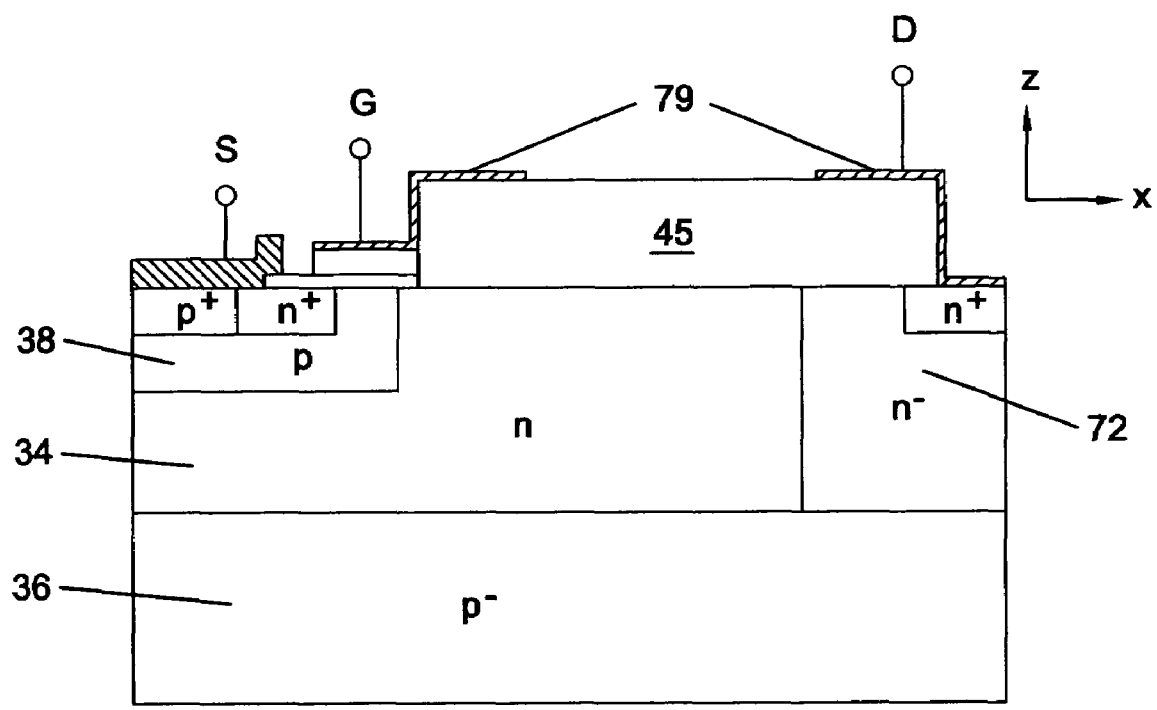
FIG. 8 depicts a cross-section of the device of FIG. 7.

It is further preferable to utilize metal field plates to reduce field crowding at the drain and under the gate. FIG. 8 illustrates a cross-sectional view that includes an oxide layer 45 (not shown in FIG. 7) that is formed over the split-drift region 71. Metal field plates 79 are provided that extend over portions of the oxide layer 45 at the drain and gate regions to reduce field crowding at the drain and under the gate.

The insertion of the RESURF region with an appropriate choice of doping concentration and length ensures that the depletion of the RESURF region extends vertically and reaches the surface before the critical field is reached. This requires that the product of the thickness of the epitaxial layer $Z_{SJ}$ and the doping $N_R$ of the RESURF region satisfy the RESURF condition in the Z direction; i.e. their product should be roughly $2\times10^{12}$ cm$^{-2}$. On the other hand the SJ pillars doping $N_{SJ}$ and width $Y_N$, $Y_P$ should satisfy the RESURF condition in the transverse Y direction to ensure that the pillars are completely depleted of their charge carriers before the maximum field reaches the critical electric field at the physical SJs.

Figure 9:
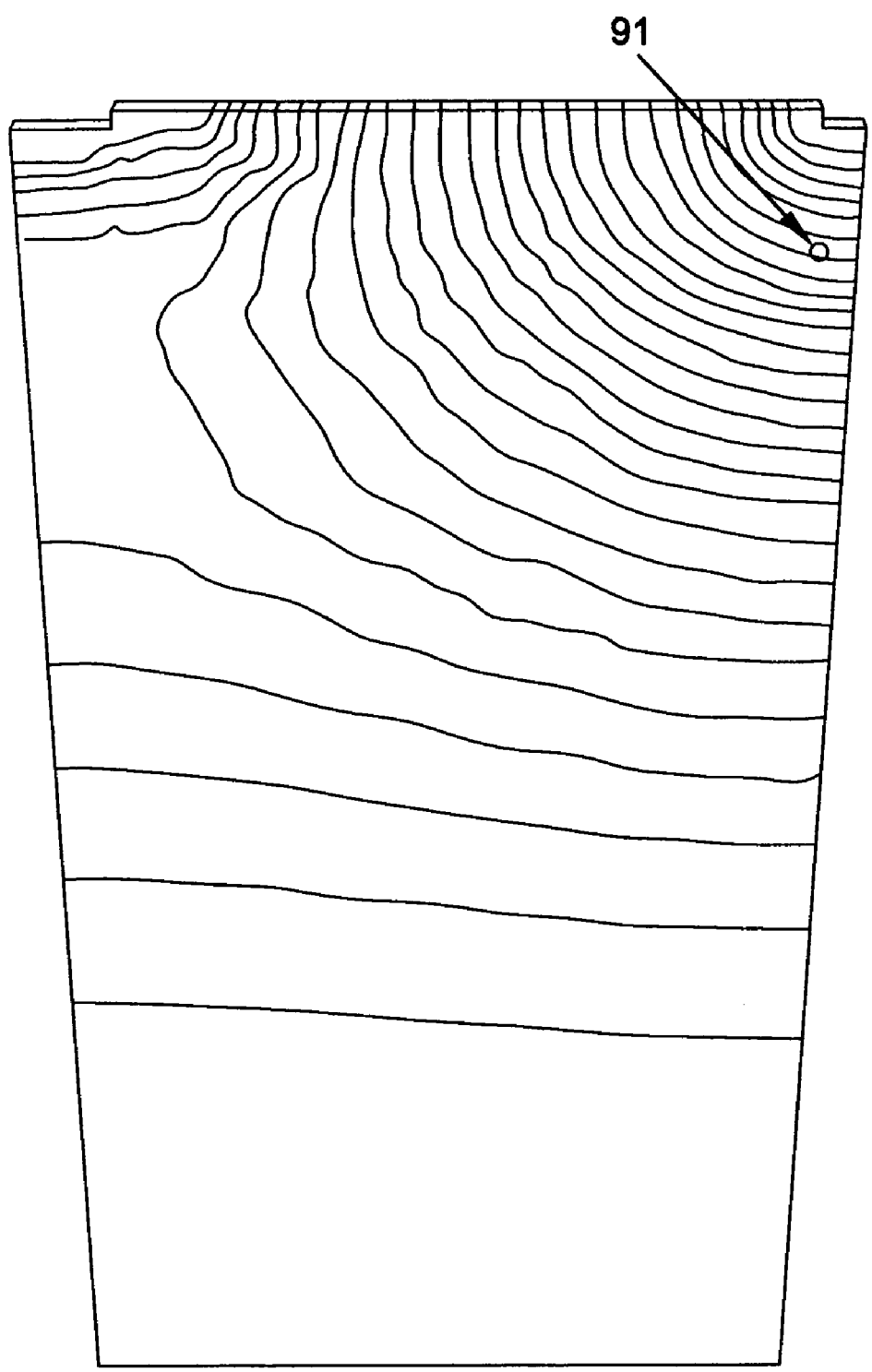
FIG. 9 depicts the equipotential plot of the device of FIG. 7.

Since the resistivity of the SJ drift region is much lower than that of the RESURF region (typically a factor of 5 lower), minimum specific on-resistance is achieved by making $L_{D2}$ as small as possible and much smaller than $L_{D1}$. The optimum length $L_{D2}$ is crucial to the device operation in the off-state because the RESURF region is responsible for absorbing, or suppressing, a significant portion of the substrate assisted depletion effects impact on the device. By optimizing the doping concentrations and the geometries of the RESURF and the SJ regions, one can ensure that the entire drift region is depleted in all three directions resulting in an almost uniform electric field distribution in the drift region, as is evident by the equipotential contour plots of the SJR-LDMOST in the off-state illustrated in FIG. 9 where the breakdown point 91 is indicated. The equipotential contour plots of FIG. 9 reveal that in the SJ region, the vertical electric field component is almost non-existent while in the RESURF region a vertical electric field component exists, similar to a conventional R-LDMOST. This vertical field component is responsible for depleting the RESURF region vertically, hence minimizing the substrate-assisted-depletion.

Due to the fairly uniform electric field distribution obtained in the off-state, as well as the high doping concentration and aspect ratio of the SJ pillars 34,35, SJR-LDMOSTs exhibit significant improvements in on-state performance as compared to conventional R-LDMOSTs. The specific on-resistance of three SJR-LDMOSTs with BV of 120V, 700V and 1200V with pillar aspect ratio (height to width) of 10 μm/1 μm are compared to conventional R-LDMOSTs in the table shown in FIG. 10. The characteristics of the 120V conventional R-LDMOST are obtained from A. W. Ludikhuize, J. A. Van der Pol, A. Heringa, A. Padiy, E. R. Ooms, P. van Kessel, G. J. J. Hessels, M. J. Swanenberg, B. van Velzen, H. van der Vlist, J. H. H. A. Egbers and M. Stoutjesdijk, "Extended (180V) Voltage in 0.6 μm Thin-Layer-SOI A-BCD3 Technology on 1 μm BOX for Display, Automotive & Consumer Applications", International Symposium on Power Semiconductor Devices and Ics (ISPSD), Proceedings, pp. 77–80, 2002. Specifications for the 700V and 1100V conventional R-LDMOSTs are obtained from A. W. Ludikhuize, "A Versatile 700/1200V IC Process for Analog and Switching Applications", IEEE Transactions on Electron Devices, vol. 38, pp. 1582–1589, 1991. The specific on-resistances of the SJR-LDMOST are significantly lower than their R-LDMOST counterparts. Further improvements are expected by increasing the height to width aspect ratio of the pillars. High aspect ratio pillars can be implemented by using reactive ion etching of silicon trenches followed by selective epitaxial growth of appropriately doped silicon to refill the trench (the process is subsequently repeated for the opposite polarity pillar) or by doping the sidewalls of the trenches using tilted ion-implantations of boron and phosphorous impurities at low incident angle directed at opposite sidewalls of the trench followed by deposition of oxide to refill the trenches.

The superior on-state performance of the proposed SJR-LDMOST implies a considerable area saving which in turn reduces the parasitic capacitances including the Miller feedback capacitance; switching and drive gate losses are reduced accordingly.

What is claimed:

1. A lateral double-diffused MOSFET semiconductor device comprising:
    a substrate;
    an epitaxial layer formed on the substrate;
    a well region formed in the epitaxial layer;
    a source region formed in the well region;
    a drain region formed in the epitaxial region;
    a gate region located above at least a portion of the well region; and
    a split drift region in the epitaxial layer and comprised of a super-junction region and a RESURF region, located between the source region and the drain region,
    wherein the RESURF region is positioned between the super-junction region and the drain region.

2. The device of claim 1, wherein the super-junction region is positioned between the well region and the RESURF region.

3. The device of claim 1, wherein the super-junction region comprises a plurality of alternately arranged first semiconductor region of a first conductivity type and second semiconductor region of a second conductivity type.

4. The device of claim 1, wherein the RESURF region is located adjacent to the drain region.

5. The device of claim 4, wherein the RESURF region comprises a first conductivity type and the substrate comprises a second conductivity type.

6. The device of claim 1, wherein the length of the RESURF region is substantially less than the length of the super-junction region.

7. The device of claim 6, wherein the product of the doping concentration and the vertical thickness of the RESURF region is about $2\times10^{12}$ cm$^{-2}$.

8. The device of claim 3, wherein the product of the doping concentration and a width of each first or second semiconductor region of the super-junction region is about $2\times10^{12}$ cm$^{-2}$.

9. The device of claim 1, wherein the RESURF region is doped less than the super-junction region.

10. The device of claim 1, wherein the RESURF region is doped less than the drain region.

11. The device of claim 1, wherein the RESURF region is doped less than the super-junction region and the drain region.

* * * * *